(12) United States Patent
Krauska (10) Patent No.: US 11,946,994 B2
(45) Date of Patent: Apr. 2, 2024

(54) SYNCHRONIZATION OF UNSTABLE SIGNAL SOURCES FOR USE IN A PHASE STABLE INSTRUMENT

(71) Applicant: Tektronix, Inc., Beaverton, OR (US)

(72) Inventor: Alexander Krauska, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 17/548,381

(22) Filed: Dec. 10, 2021

(65) Prior Publication Data

US 2022/0099782 A1 Mar. 31, 2022

Related U.S. Application Data

(62) Division of application No. 14/827,146, filed on Aug. 14, 2015, now abandoned.

(51) Int. Cl.
G01R 35/00 (2006.01)
G01R 27/28 (2006.01)
H04L 7/033 (2006.01)

(52) U.S. Cl.
CPC ......... *G01R 35/005* (2013.01); *G01R 27/28* (2013.01); *H04L 7/0331* (2013.01)

(58) Field of Classification Search
CPC ...... G01R 35/005; G01R 27/28; H04L 7/0331
See application file for complete search history.

(56) References Cited

U.S. PATENT DOCUMENTS

| 2005/0239506 A1* | 10/2005 | Li .................. H01Q 3/267 455/562.1 |
| 2010/0204943 A1 | 8/2010 | Heuermann |
| 2017/0195072 A1* | 7/2017 | Lomnitz ........... H04B 17/309 |

FOREIGN PATENT DOCUMENTS

WO  2014176540  10/2014

OTHER PUBLICATIONS

European Patent Office, Extended European Search Report and Written Opinion for Patent Application No. 21215405.8, dated May 17, 2022, 7 pages, Munich, Germany.

* cited by examiner

*Primary Examiner* — Christine A Enad
(74) *Attorney, Agent, or Firm* — Miller Nash LLP; Andrew J. Harrington (57) ABSTRACT

A vector network analyzer (VNA) can include a control processor, a receiver coupled with the control processor, switching circuitry coupled with the receiver, a radio frequency (RF) bridge coupled with the switching circuitry, a transmission line coupled with the RF bridge, wherein the transmission line is configured to be coupled with a load; and a signal generator coupled with the RF bridge.

4 Claims, 7 Drawing Sheets

SYNCHRONIZATION OF UNSTABLE SIGNAL SOURCES FOR USE IN A PHASE STABLE INSTRUMENT

CROSS-REFERENCE TO RELATED APPLICATIONS

This application is a divisional application of, and claims priority to, U.S. patent application Ser. No. 14/827,146, filed Aug. 14, 2015, the entire contents of which are hereby incorporated by reference into this application.

TECHNICAL FIELD

The present disclosure relates generally to electronic test and measurement devices, such as Vector Network Analyzers (VNAs), Vector Signal Analyzers, Spectrum Analyzers, Vector Signal Generators, and signal generators.

BACKGROUND

In prior instruments, such as a tracking generator or vector network analyzer (VNA), a plurality of phase-stable measurements of a device under test (DUT) reflection and/or transmission must be made. Single or multiple generators and receivers share a common local oscillator (LO) to assure phase stability. Calibration of the system is performed using external reflection standards, which rely on coherent phase between the calibration moment and the measurement moment. For reasons of cost reduction and simplification of the hardware, it would be desirable to use phase-incoherent but frequency-stable LO sources for the receiver and generator rather than sharing a common synthesizer architecture. The common VNA has a reflection bridge or coupler arrangement of various types on the generator port. A signal reference coupled from the generator is routed to the receiver but has a phase error that is proportionate to the reflection coefficient of the ($\arcsin(V_{ref}/V_{norm})$), making the reference generator phase relative to the receiver difficult to obtain from this port alone without relying on the phase coherence of a common LO system between the generator and receiver.

Figure 1:
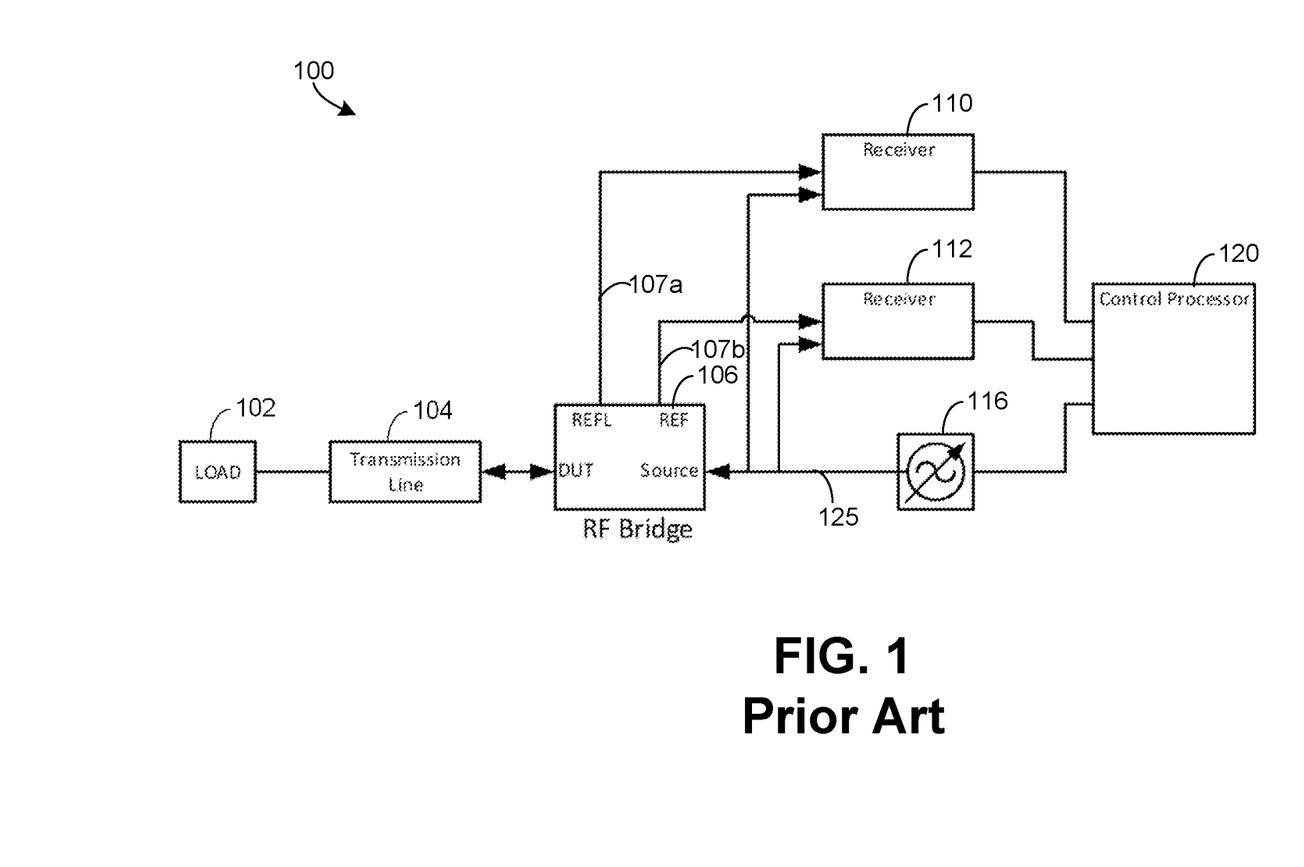
FIG. 1 is a block diagram illustrating an example of a prior vector network analyzer (VNA) or tracking generator having multiple receivers and a shared signal.

FIG. 1 is a block diagram illustrating an example of a prior vector network analyzer (VNA) or tracking generator 100 having multiple receivers 110 and 112 and a shared signal 125 (e.g., from a control processor 120 by way of an LO 116). In the example, a common source 102 provides an injection signal to a radio frequency (RF) bridge 106 (e.g., via a transmission line 104), as well as reference signals 107a and 107b to multiple receivers 110 and 112, respectively.

It should be noted that, while two receivers 110 and 112 are shown to measure two signals (e.g., Reference and Reflection ports of a bridge), any number of multiple receivers can be used to measure a high number of signals from more complex multi-channel bridges, couplers, or similar networks. Multiple receivers can be eliminated with a single receiver if a phase-stable switch can be connected in such a way that the bridge loading is not disturbed when the paths are switched.

Figure 2:
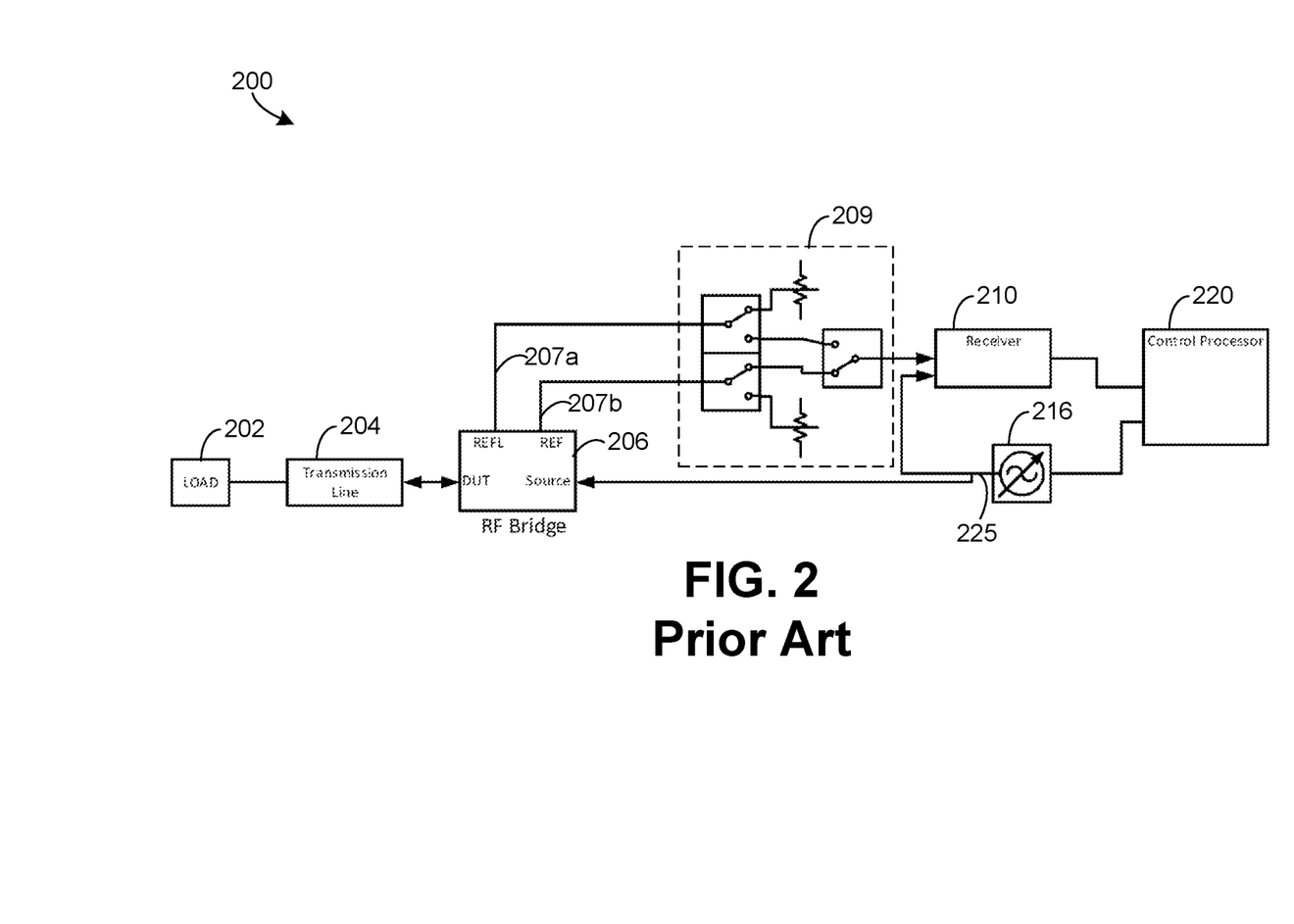
FIG. 2 is a block diagram illustrating an example of a prior VNA or tracking generator having a single receiver and a shared signal.

FIG. 2 is a block diagram illustrating an example of a prior VNA or tracking generator 200 having a single receiver 210 and a shared signal 225 (e.g., from a control processor 220 by way of an LO 216). Similar to the VNA or tracking generator 100 illustrated by FIG. 1, a common source 202 provides an injection signal to a radio frequency (RF) bridge 206 (e.g., via a transmission line 204), as well as reference signals 207a and 207b to switching circuitry 209 that is coupled with the receiver 210. In general, the shared signal may be the bridge stimulus itself or an LO created in a phase stable way within the signal source.

SUMMARY

Implementations of the disclosed technology generally include systems or devices that use an additional signal path in order to allow for a relative phase measurement between a generator and a receiver, insensitive to external load conditions. Such embodiments may advantageously allow a receiver and generator having relatively unstable independent local oscillators (LOs) to be used in a phase-stable measurement of network response. This may advantageously allow a single receiver and generator to establish their relative phase or, in embodiments involving multiple receivers and multiple generators, to establish their relative phase.

DETAILED DESCRIPTION

Implementations of the disclosed technology generally include electronic test and measurement devices, such as vector network analyzers (VNAs) having a calibration path. Such embodiments may advantageously include separate signal sources in the receiver(s) and signal source to allow for higher stability and accuracy in the bridge measurement. Also, variable static phase offsets in either the receive synthesizer or source synthesizer may be sensed and removed as an error term in the measurement. Further, costs may be reduced due to the availability of single integrated circuit (IC) integrated synthesizers that cover wide bandwidths at low cost.

Figure 3:
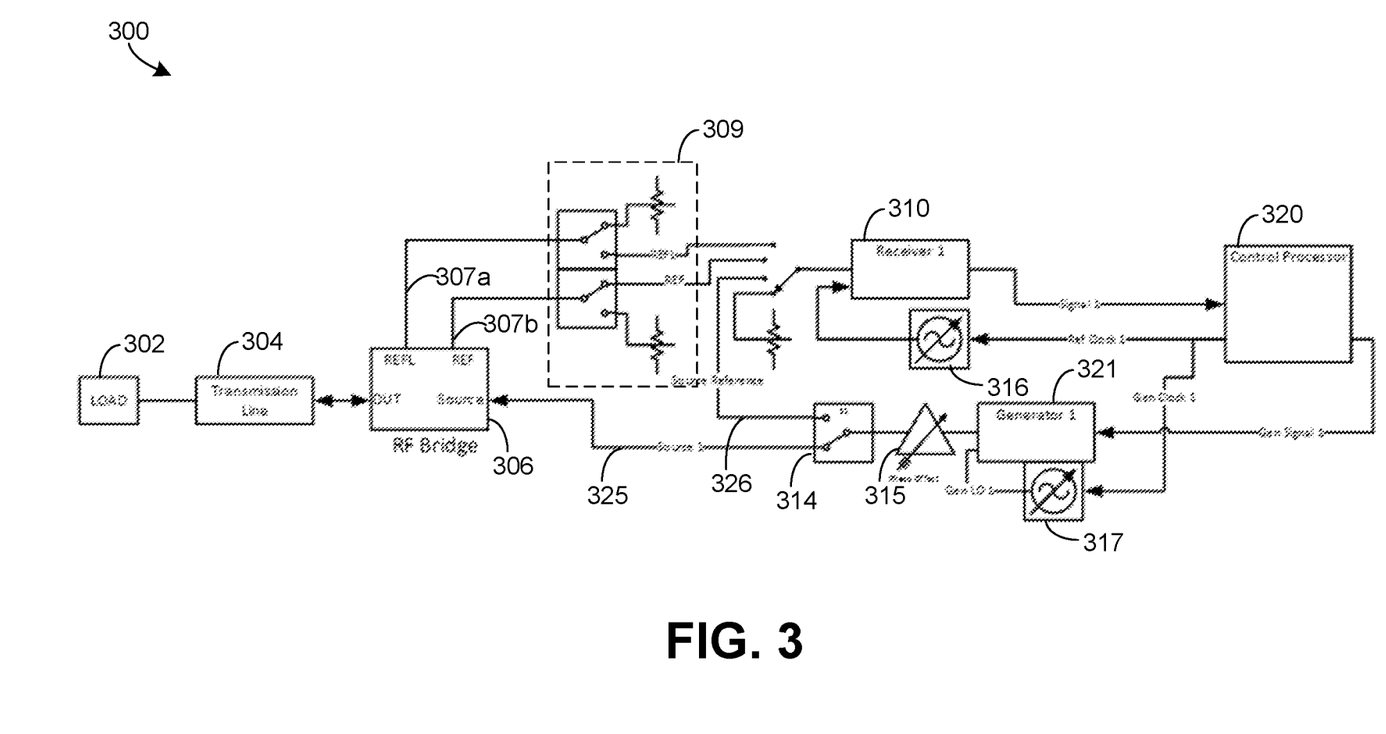
FIG. 3 is a block diagram illustrating an example of a VNA or tracking generator having a calibration path in accordance with certain implementations of the disclosed technology.

FIG. 3 is a block diagram illustrating a first example of a VNA or tracking generator 300 having a load 302, a transmission line 304, a radio frequency (RF) bridge 306 provide reference signals 307a and 307b to switching circuitry 309, and a calibration path in accordance with certain implementations of the disclosed technology. In the example, a separate signal source 325 (e.g., by way of a generator 321, an LO 317, and a switch 314) and receive reference 326 are shown with a phase shift 315 shown in series with the signal source to represent the random phase offset to the receive channel. Each of the signal sources is phase locked to a common reference and controlled by a common control processor 320, and the signal source may have an unknown phase. While a single receiver 310 is shown, it should be noted that multiple receivers may be synchronized using similar implementations.

In the example, the signal channel generator 321 has a single channel receiver for sensing the magnitude and phase of a single reflection bridge/coupler 306, e.g., used in a one-port VNA. The generator 321 and receiver 310 may use either continuous wave or modulated data. The receiver(s) may be constructed each having an independent local oscillator, e.g., with independent phase. The phase offset 315 from the source may be determined by sampling the "source Reference path." Here, S1 may either refer to a switch or a coupling or power dividing network. In embodiments where a single receiver is used to sample a single port or multiple bridge ports, the switch may be designed to provide a consistent load to the bridge in all switch positions. This may be accomplished using signal path attenuation, impedance matching, buffering by amplification, and terminated switch networks, for example.

Figure 4:
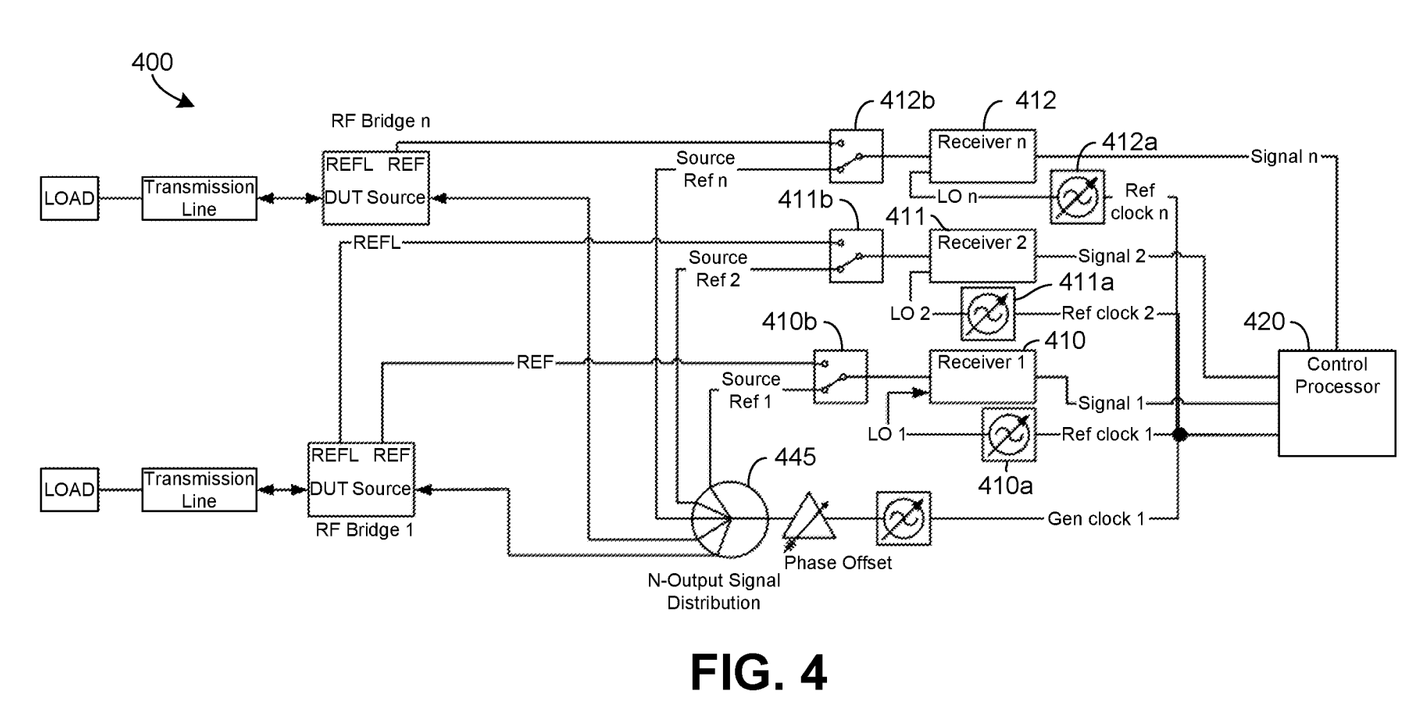
FIG. 4 is a block diagram illustrating an example of a VNA or tracking generator having a common generator source in accordance with certain implementations of the disclosed technology.

FIG. 4 is a block diagram illustrating an example of a VNA or tracking generator 400 having a common generator source (e.g., from a control processor 420 by way of an LO 317) in accordance with certain implementations of the disclosed technology. In the example, multiple receivers 410, 411, and 412 having independent LOs 410a, 411a, and 412a, respectively, and multiple phase offsets may be synchronized to a common reference. In this view, the multiple source reference signals are distributed by way of a coupler/power divider network 445. In alternate embodiments, a switch may be implemented instead of the coupler/power divider network 445.

In the example, the receivers 410-412 and generators can be phase synchronized by tuning each to the same frequency, switching to the "Source Reference" signal, and measuring the relative phase. Frequency offsets between the source and receivers may be accommodated if these signals are within the processing bandwidth of the receivers 410-412. It should be noted that the receivers 410-4112 are generally analog or digital receivers with superheterodyne, homodyne, direct conversion, or similar receiver techniques. Single or multiple LO signals may be generated by each receiver. For example LO 1 (410a) may be actually three LO signals (e.g., LO1a, LO2b, and LO1c for a three-stage superheterodyne converter). The generator may either be a direct signal source (e.g., a VCO and PLL, direct digital source, or direct analog source) or an indirect signal source (e.g., with a local oscillator and baseband signal, or multiple location oscillators and a baseband signal), with either a modulated or continuous wave baseband signal.

Figure 5:
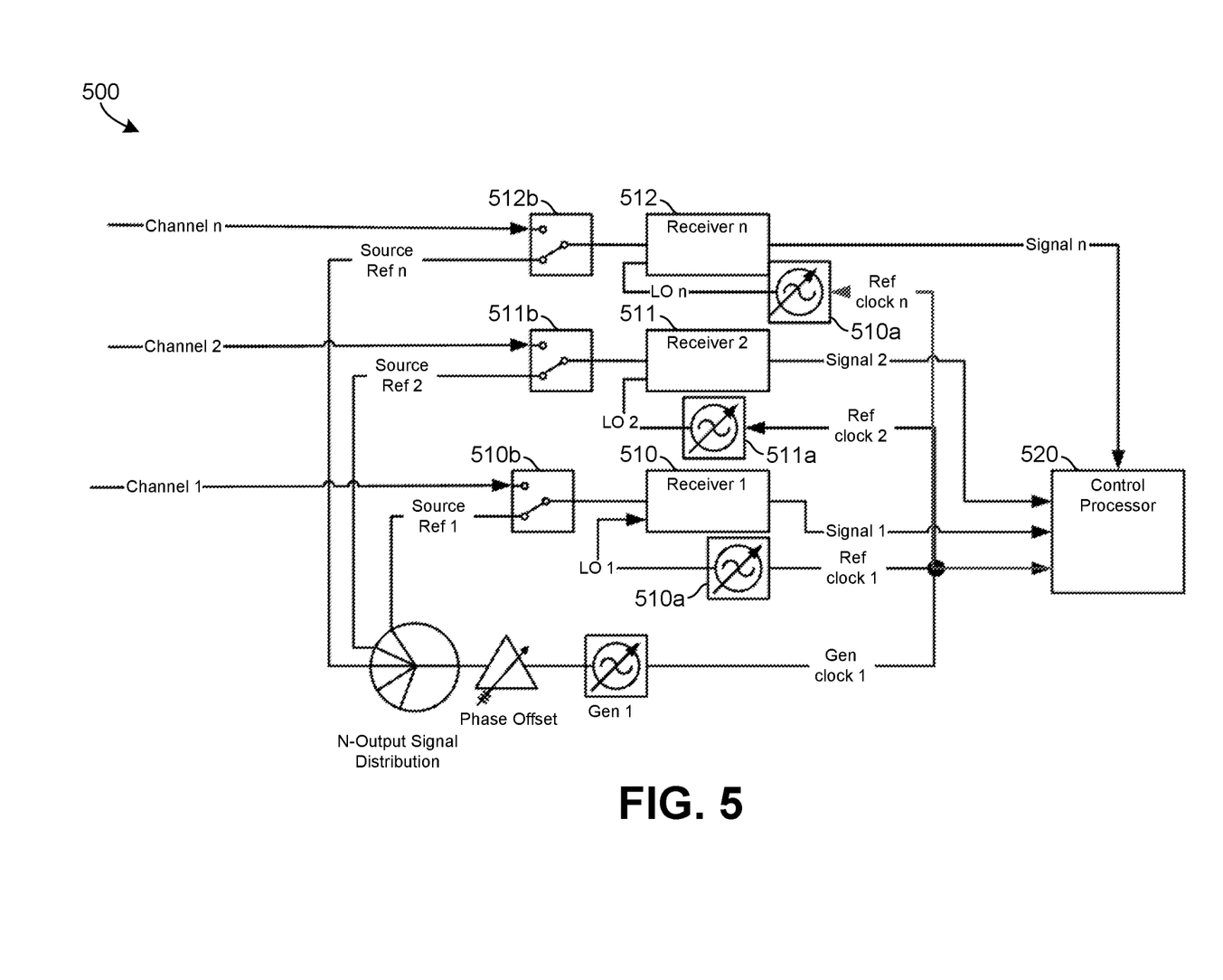
FIG. 5 is a block diagram illustrating a first example of a VNA or tracking generator having multiple receivers that are synchronized by a common reference signal in accordance with certain implementations of the disclosed technology.

FIG. 5 is a block diagram illustrating a first example of a VNA or tracking generator 500 having multiple receivers that are synchronized by a common reference signal in accordance with certain implementations of the disclosed technology. In the example, a single control processor 520 may control multiple receivers 510, 511, and 512 having independent LOs 510a, 511a, and 512a, respectively with random phase offsets. N Source reference signals are routed from a single generator. While simplified signal source is shown in the figure, this signal source may be an indirect signal source (e.g., with a local oscillator and baseband signal, or with multiple LOs and a baseband signal) with either a modulated or continuous wave baseband signal or a direct signal source such as a VCO and PLL, direct digital source, or direct analog source. The phase offset represents random phase offset that may be present between each receiver and the generator.

Figure 6:
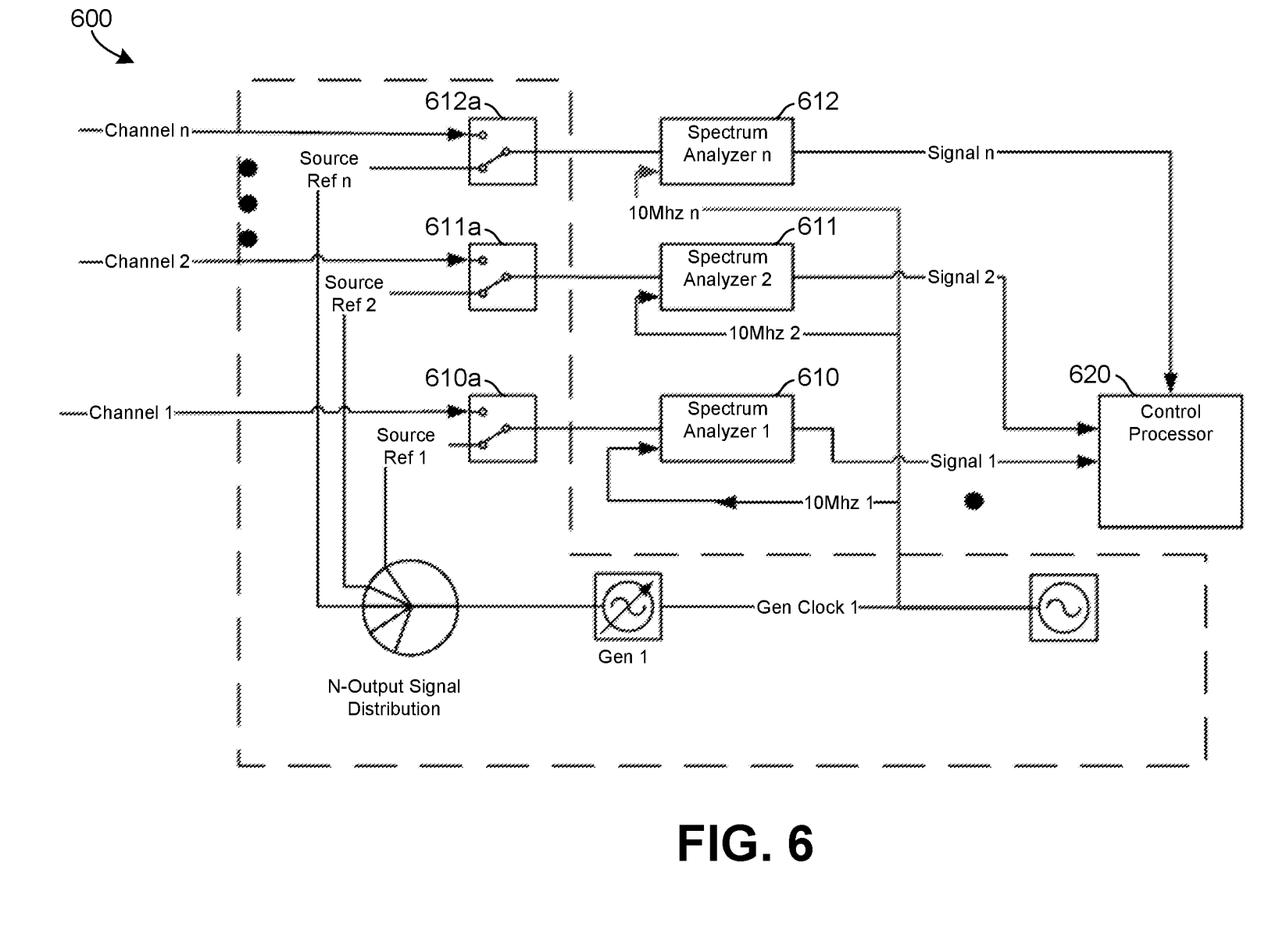
FIG. 6 is a block diagram illustrating a second example of a VNA or tracking generator having multiple receivers that are synchronized by a common reference signal in accordance with certain implementations of the disclosed technology.

FIG. 6 is a block diagram illustrating a second example of a VNA or tracking generator 600 having multiple receivers that are synchronized by a common reference signal in accordance with certain implementations of the disclosed technology. In the example, synchronizer circuitry 601 consists of a signal source (Gen1), a common reference clock (e.g., which produces 10 MHz 1 . . . 10 MHz N outputs to synchronize n external spectrum analyzers 610, 611, and 612), a 10 MHz or other suitable signal to synchronize the reference generator "Gen 1", signal routing and switching circuitry 610a, 611a, and 612a, respectively, to each spectrum analyzer RF input, and N-RF inputs. Signal 1 to Signal n inputs to the control processor 620 may include several USB data signals or any other common data bus, such as USB/PXI/VXI etc.

Figure 7:
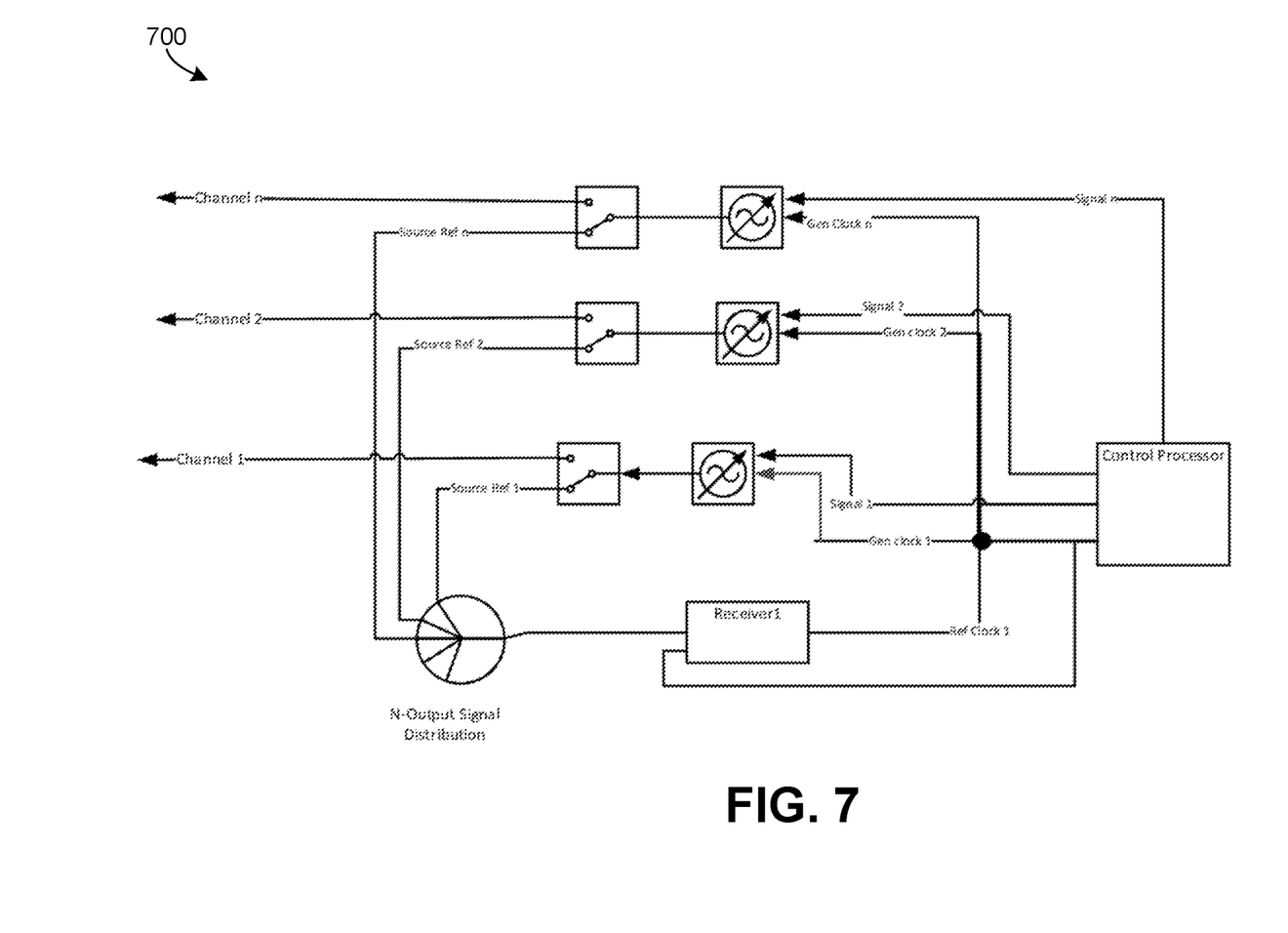
FIG. 7 is a block diagram illustrating an example of a VNA or tracking generator having multiple signal sources that are synchronized by a single receiver in accordance with certain implementations of the disclosed technology.

FIG. 7 is a block diagram illustrating an example of a VNA or tracking generator 700 having multiple signal sources that are synchronized by a single receiver in accordance with certain implementations of the disclosed technology. In the example, generator channel SPDT switches may be of internal-terminated form when the path is open. The stability of bridge response during switching may be improved using buffers, amplification, attenuation, or other suitable mechanisms. Signal 1 may be modulated or a continuous wave signal. The signal source may be a direct source of heterodyne source. The phase offset of each generator may be sensed relative to the others by way of a common receiver, for example.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments that are described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A vector network analyzer, comprising:
a control processor;
a receiver coupled with the control processor;
switching circuitry coupled with the receiver;
a radio frequency (RF) bridge coupled with the switching circuitry;

a transmission line coupled with the RF bridge, wherein the transmission line is configured to be coupled with a load;

a signal generator coupled with the RF bridge, wherein the signal generator is configured to provide a source signal to the RF bridge;

a local oscillator (LO) coupled with the signal generator; and a switch coupled with the signal generator and configured to switch the source signal between the RF bridge and the receiver.

2. The vector network analyzer of claim 1, wherein the RF bridge is configured to provide a plurality of reference signals to the switching circuitry.

3. The vector network analyzer of claim 1, further comprising a second local oscillator (LO) coupled with the receiver.

4. The vector network analyzer of claim 1, wherein the control processor is configured to phase lock the signal generator to a common reference.

* * * * *